United States Patent
Yang

(10) Patent No.: US 7,881,140 B2
(45) Date of Patent: Feb. 1, 2011

(54) APPARATUS AND METHOD FOR CONTROLLING REFRESH WITH CURRENT DISPERSION EFFECT IN SEMICONDUCTOR DEVICE

(75) Inventor: Jong Yeol Yang, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 117 days.

(21) Appl. No.: 12/229,362

(22) Filed: Aug. 22, 2008

(65) Prior Publication Data

US 2009/0238015 A1  Sep. 24, 2009

(30) Foreign Application Priority Data

Mar. 18, 2008 (KR) .................. 10-2008-0024987

(51) Int. Cl.
 *G11C 7/00* (2006.01)
(52) U.S. Cl. ............ 365/222; 365/191; 365/205; 365/196; 365/230.03; 365/230.06
(58) Field of Classification Search ............ 365/222, 365/191, 205, 196, 194, 230.03, 230.06
See application file for complete search history.

(56) References Cited

U.S. PATENT DOCUMENTS

| | | | |
|---|---|---|---|
| 7,359,269 B2 | 4/2008 | You | |
| 7,359,270 B2 | 4/2008 | Lee | |
| 2003/0214870 A1* | 11/2003 | Cho | ............ 365/222 |
| 2004/0032772 A1* | 2/2004 | Takahashi | ............ 365/202 |
| 2008/0137464 A1* | 6/2008 | Kim | ............ 365/222 |

FOREIGN PATENT DOCUMENTS

| | | |
|---|---|---|
| KR | 10-1999-084553 | 12/1999 |
| KR | 10-2000-0067558 A | 11/2000 |
| KR | 10-2003-0078352 A | 10/2003 |
| KR | 10-2006-0020286 A | 3/2006 |

* cited by examiner

*Primary Examiner*—Thong Q Le
(74) *Attorney, Agent, or Firm*—John P. White; Cooper & Dunham LLP

(57) ABSTRACT

A refresh control apparatus is provided which is capable of dispersing a peak current at an all-bank refresh mode and reducing the characteristic difference between the banks. The refresh control apparatus includes an internal refresh counter for outputting row address signals to select word lines when a refresh command is inputted from an external circuit, a row decoder for outputting row decoding signals to select all banks in response bank active signals and the row address signals, an enable signal control unit for sequentially outputting at a time interval sense amplifier enable signals in response to the bank active signals and the refresh command, and a sense amplifier for sequentially refreshing all of the banks at a time interval in response to the sense amplifier enable signals.

17 Claims, 7 Drawing Sheets

APPARATUS AND METHOD FOR CONTROLLING REFRESH WITH CURRENT DISPERSION EFFECT IN SEMICONDUCTOR DEVICE

TECHNICAL FIELD

This disclosure relates to a semiconductor memory device and, more particularly, to an apparatus and a method for controlling a refresh in a semiconductor memory device.

BACKGROUND

Generally, in a volatile semiconductor memory device such as a DRAM, a refresh operation is required to prevent data loss.

This is because a cell capacitor to form a unit cell of a data storage does not have an ideal data storage feature, that is, because stored charges in the capacitor disappear with a leakage current shortly after a write operation.

Accordingly, before the stored data are fully extinguished, a refresh operation which verifies and restores the data has to be carried out.

FIG. 1 is a timing chart illustrating a refresh operation in a conventional memory device. Referring to FIG. 1, when an all-bank refresh mode to simultaneously refresh all banks is carried out, an enable timing of each bank is differently taken in order to reduce a peak current.

That is, the conventional refresh method reduces the peak current by sequentially delaying the enable timing of each bank in the all-bank refresh mode.

FIG. 2 is a graph illustrating a peak current characteristic in the conventional refresh of FIG. 1. Referring to FIG. 2, the peak current of the refresh can be dispersed by making bank enable timings different from each other.

However, in this refresh operation, the data refresh section is relatively short in the rest of the banks except for a first enabled bank so that they are different from each other in the refresh features according to the shortness of the refresh section. This phenomenon increases an auto refresh time and there is a possibility that the refresh deteriorates according to the characteristic difference between the banks in case of a normal refresh mode.

SUMMARY

In an aspect of this disclosure, apparatus and method for dispersing a peak current at an all-bank refresh mode and reducing the characteristic difference between the banks are provided.

In one embodiment, a semiconductor device has a refresh control apparatus which comprises an enable signal control unit configured to sequentially delay and output sense amplifier enable signals in response to bank active signals and a refresh command.

In another embodiment, a semiconductor device has a refresh control apparatus which comprises an internal refresh counter configured to output row address signals to select word lines when a refresh command is inputted from an external circuit, a row decoder configured to output row decoding signals to select all banks in response bank active signals and the row address signals, an enable signal control unit configured to sequentially output at a time interval sense amplifier enable signals in response to the bank active signals and the refresh command, and a sense amplifier configured to sequentially refresh all of the banks at a time interval in response to the sense amplifier enable signals.

In still another embodiment, a method for refreshing a semiconductor device comprises simultaneously activating all banks in response to bank active signals, sequentially activating sense amplifier enable signals at a time interval in response to the bank active signals and a refresh command, and sequentially refreshing the activated banks at a time interval in response to the sense amplifier enable signals.

The present invention has an effect on current dispersion by activating all of the banks at a refresh operation, making word line enabling timings the same, and making sense amplifier enabling timings different from each other.

Also, according to the present invention, an enablement of a specific bank does not have an influence on other blanks because word lines are simultaneously enabled.

Further, the present invention compensates for a refresh feature in which a bank is lately enabled because there is a difference between delta voltages (ΔV: voltage difference) of the pairs of bit lines on a basis of bank due to the enabling timings between the sense amplifiers before a sense amplifying operation.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF THE PREFERRED EMBODIMENTS

Hereinafter, the present invention will be described in detail through embodiments. The embodiments are provided merely to exemplify the present invention, and the scope of this disclosure and the appended claims is not limited by them.

Figure 1:
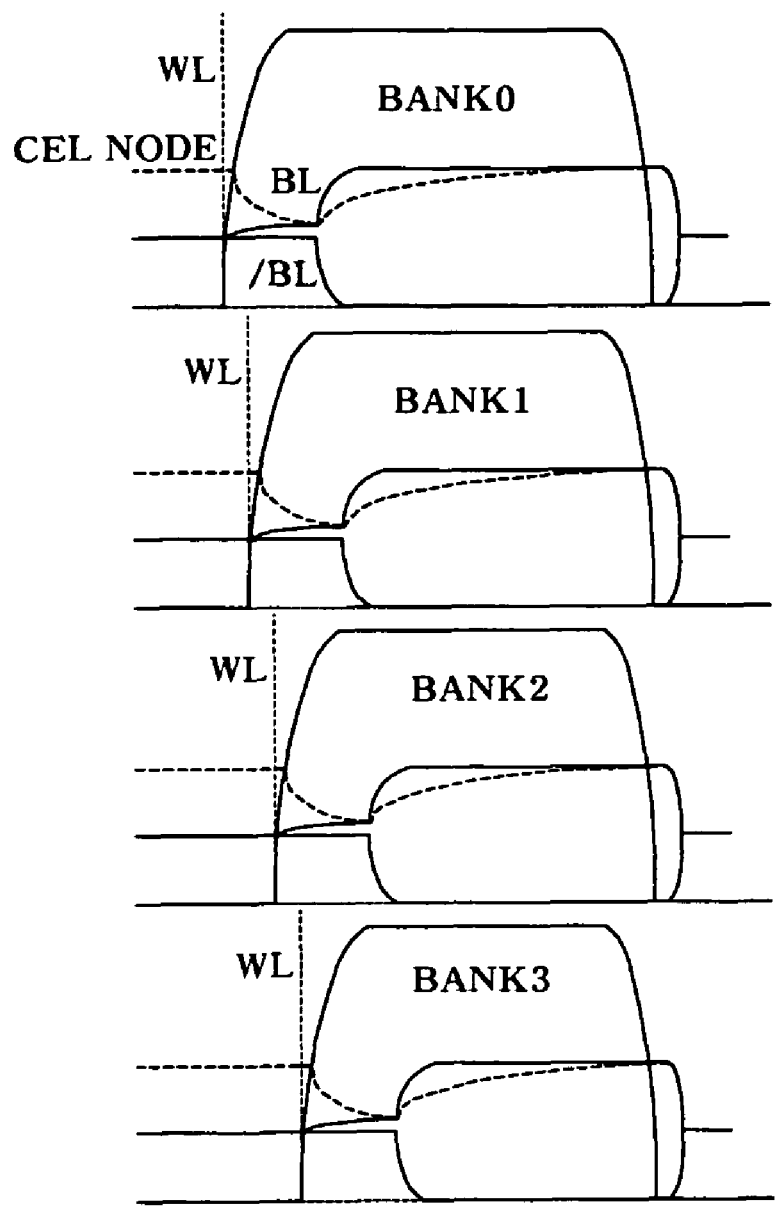
FIG. 1 is a timing chart illustrating a refresh operation in a conventional memory device.
Figure 2:
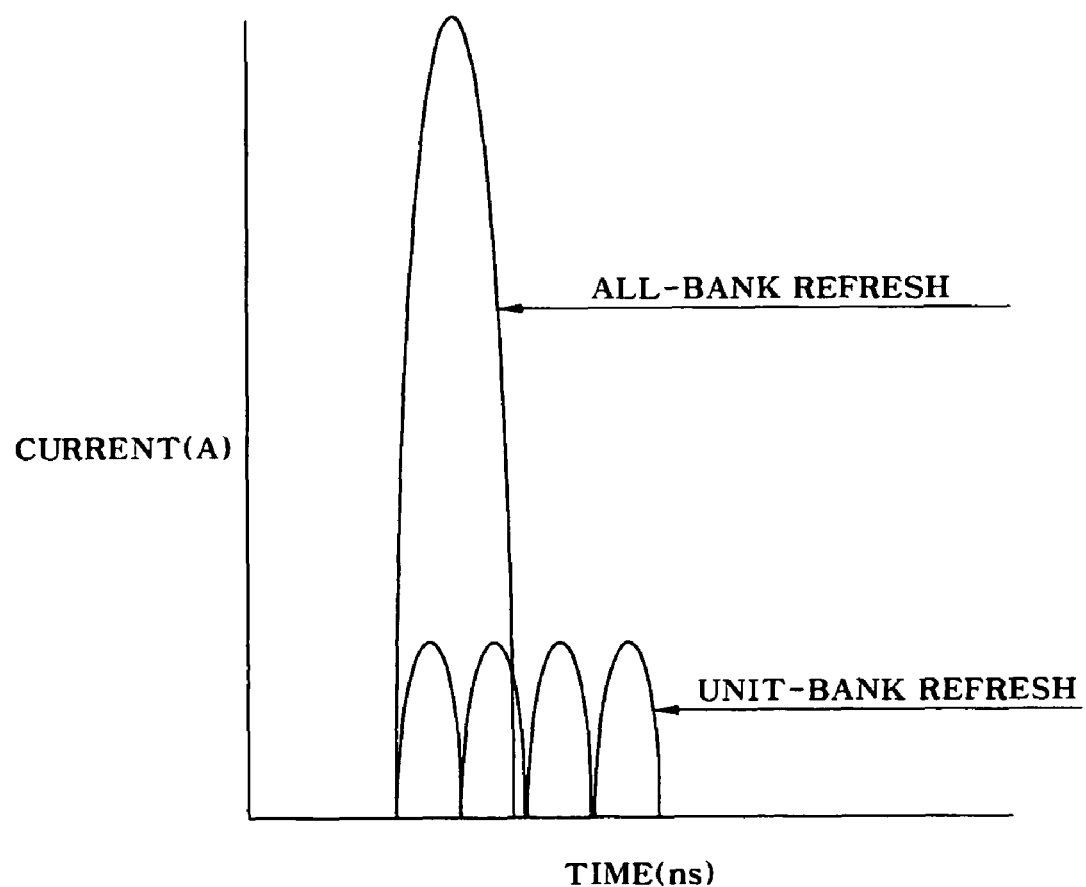
FIG. 2 is a graph illustrating a peak current characteristic in the conventional refresh operation of FIG. 1.
Figure 3:
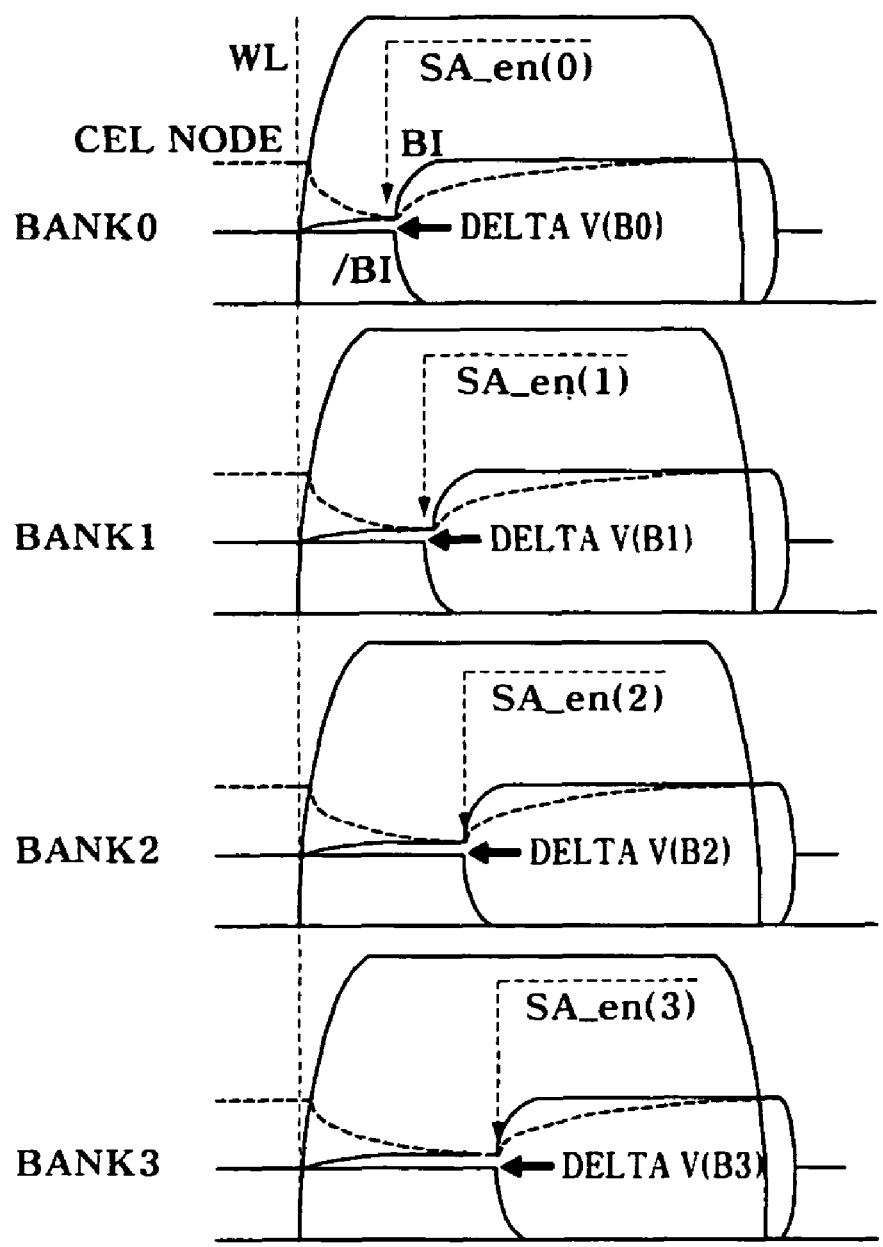
FIG. 3 is a timing chart illustrating an example of timing of a refresh operation according to one embodiment of this disclosure.

FIG. 3 is a timing chart illustrating an example of timing of a refresh operation according to one embodiment of this disclosure.

Referring to FIG. 3, in the refresh operation according to the embodiment, enabling timings of word lines are the same by simultaneously enabling all of the banks, and sense amplifiers have a time difference in enabling timings to have the current dispersion effect.

Since the word lines are simultaneously enabled in such refresh operation, enablement of a specific bank does not influence on other banks. Further, the refresh operation compensates for a refresh feature in which a bank is lately enabled because there is a difference between delta voltages (ΔV: voltage difference) of the pairs of bit lines on a basis of bank due to the enabling timings between the sense amplifiers before a sense amplifying operation.

Figure 4:
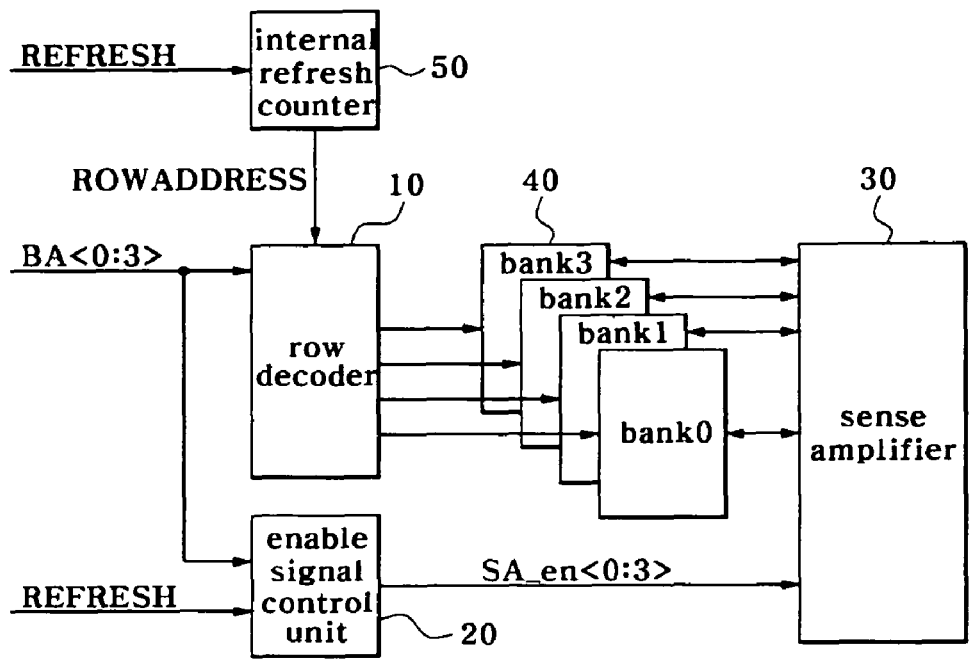
FIG. 4 is a block diagram illustrating a refresh control circuit according to one embodiment of this disclosure.

FIG. 4 is a block diagram illustrating a refresh control circuit according to one embodiment of this disclosure.

Referring to FIG. 4, the refresh control circuit includes an internal refresh counter 50 for outputting row address signals to select word lines in response to a refresh command REFRESH from an external circuit, and a row decoder 10 for outputting row decoding signals to simultaneously activate all of banks 40 in response to first to fourth bank active signals BA<0:3> and the row address signals.

Also, the refresh control circuit includes an enable signal control unit 20 for sequentially outputting at a time interval first to fourth sense amplifier enable signals SA_en<0:3>, which correspond respectively to the banks 40, in response to the first to fourth bank active signals BA<0:3> and the refresh command REFRESH, and a sense amplifier 30 for sequentially refreshing all of the banks 40, which are enabled by the row deciding signals, in response to the first to fourth sense amplifier enable signals SA_en<0:3>.

Figure 5:
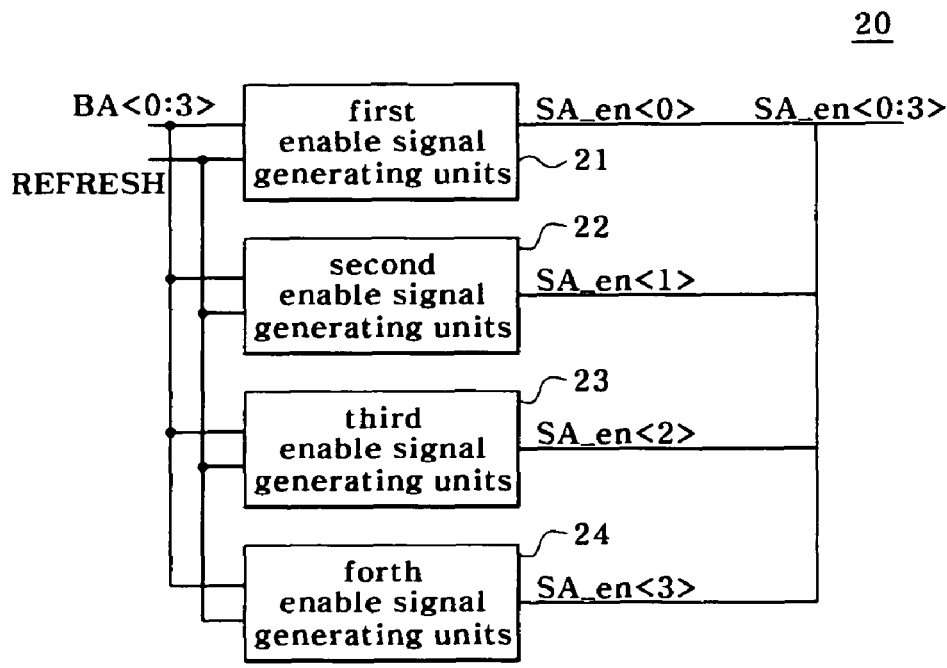
FIG. 5 is a block diagram illustrating an enable signal control unit in the refresh control circuit of FIG. 4.

FIG. 5 is a block diagram illustrating the enable signal control unit 20 of FIG. 4. Referring to FIG. 5, the enable signal control unit 20 includes first to fourth enable signal generating units 21 to 24 which output the first to fourth sense amplifier enable signals SA_en<0:3> using the first to fourth bank active signals BA<0:3> with first to fourth delay sections, respectively, in response to the refresh command REFRESH.

Here, the first to fourth delay sections are implemented by sequentially increasing a delay time.

That is, each of the first to fourth sense amplifier enable signals SA_en<0:3> is sequentially outputted with a delay time and the delay time is determined by a corresponding one of the first to fourth delay sections.

Figure 6A:
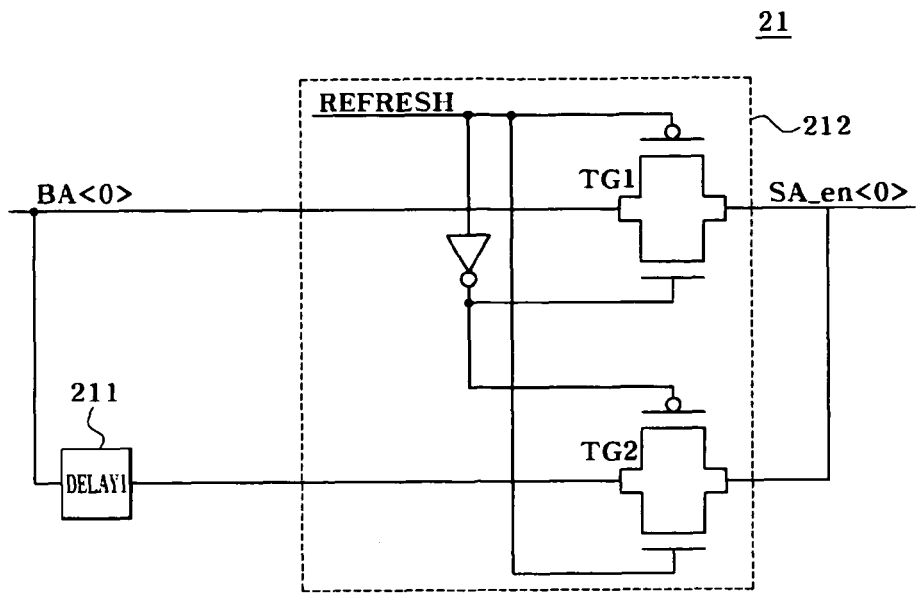
FIGS. 6A to 6D are circuit diagrams illustrating an enable signal generating unit in the enable signal control unit of FIG. 5.

FIGS. 6A to 6D are circuit diagrams illustrating the enable signal generating units of FIG. 5. Referring to FIG. 6A, the first enable signal generating unit 21 includes a first delayer 211 for delaying the first bank active signal BA<0> by the first delay section, and a first output unit 212 for sequentially outputting, as the first sense amplifier enable signal SA_en<0>, the first bank active signal BA<0> and an output signal of the first delayer 211 in response to an activation of the refresh command REFRESH.

The first output unit 212 includes a first transfer gate TG1 to output the first bank active signal BA<0> in response to the refresh command REFRESH and a second transfer gate TG2 to output the output signal of the first delayer 211 in response to the refresh command REFRESH.

Figure 6B:
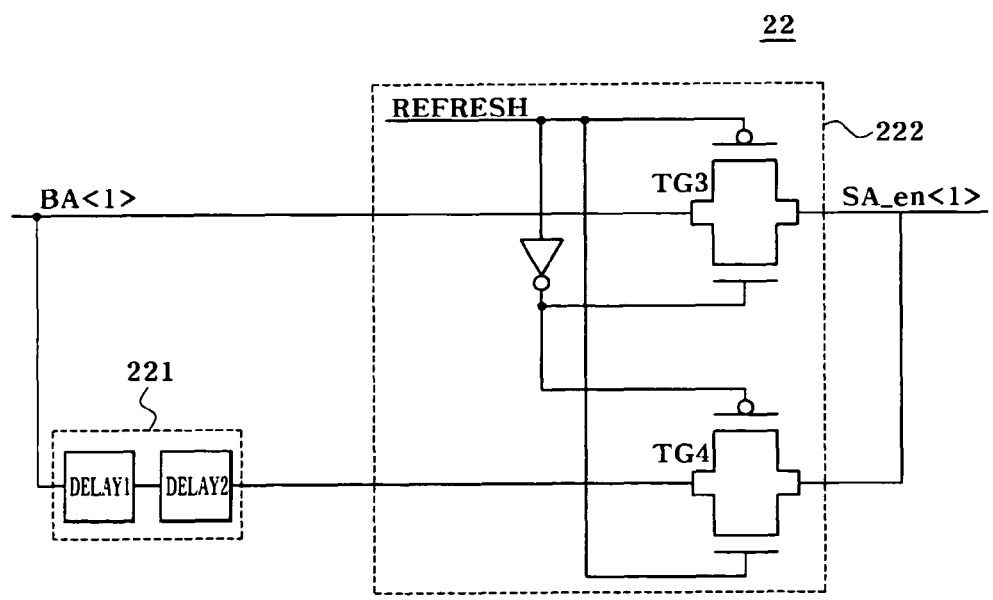

Referring to FIG. 6B, the second enable signal generating unit 22 includes a second delayer 221 for delaying the second bank active signal BA<1> by the second delay section, and a second output unit 222 for sequentially outputting, as the second sense amplifier enable signal SA_en<1>, the second bank active signal BA<1> and an output signal of the second delayer 221 in response to the activation of the refresh command REFRESH.

The second output unit 222 includes a third transfer gate TG3 to output the second bank active signal BA<1> in response to the refresh command REFRESH and a fourth transfer gate TG4 to output the output signal of the second delayer 221 in response to the refresh command REFRESH.

Figure 6C:
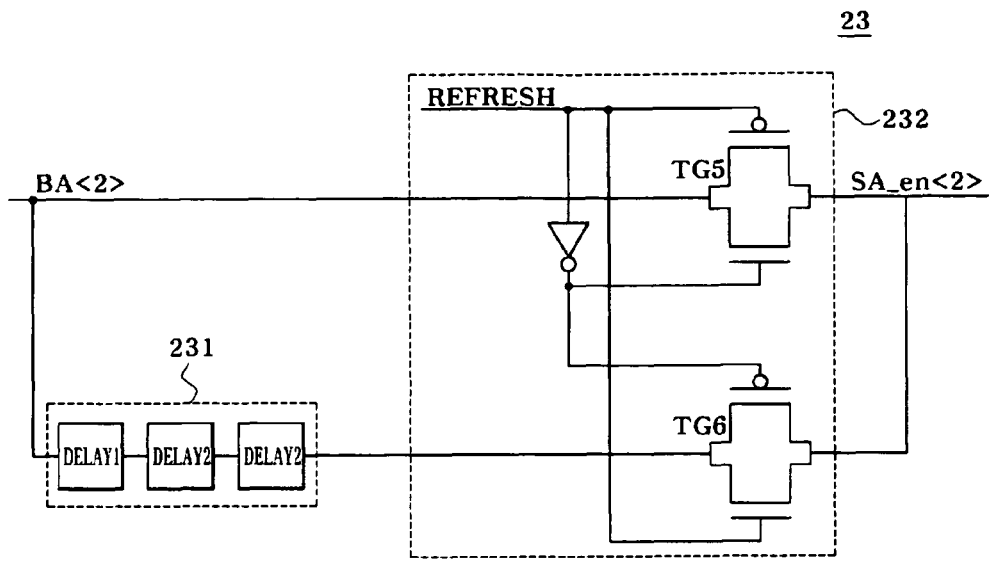

Referring to FIG. 6C, the third enable signal generating unit 23 includes a third delayer 231 for delaying the third bank active signal BA<2> by the third delay section, and a third output unit 232 for sequentially outputting, as the third sense amplifier enable signal SA_en<2>, the third bank active signal BA<2> and an output signal of the third delayer 231 in response to the activation of the refresh command.

The third output unit 232 includes a fifth transfer gate TG5 to output the third bank active signal BA<2> in response to the refresh command REFRESH and a sixth transfer gate TG6 to output the output signal of the third delayer 231 in response to the refresh command REFRESH.

Figure 6D:
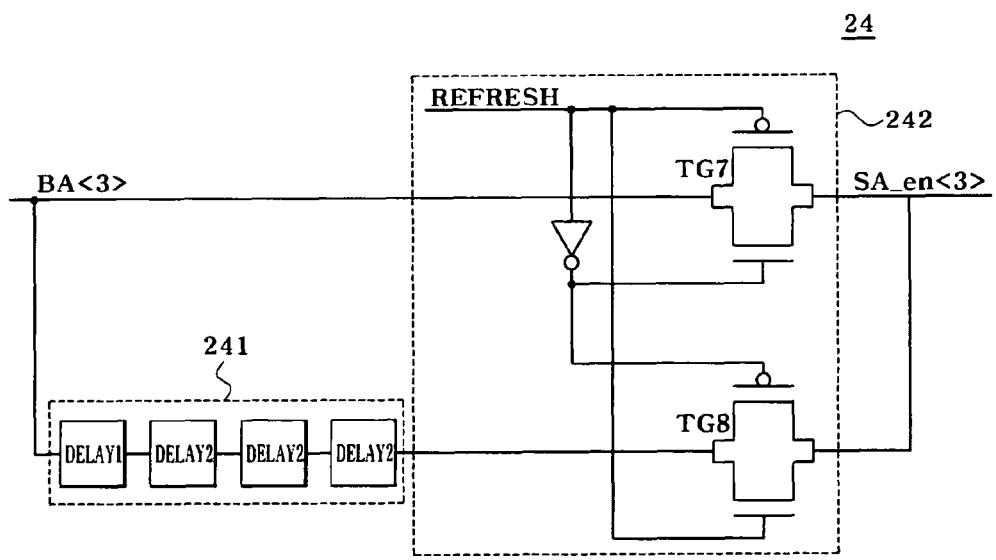

Referring to FIG. 6D, the fourth enable signal generating unit 24 includes a fourth delayer 241 for delaying the fourth bank active signal BA<3> by the fourth delay section, and a fourth output unit 242 for sequentially outputting, as the fourth sense amplifier enable signal SA_en<3>, the fourth bank active signal BA<3> and an output signal of the fourth delayer 241 in response to the activation of the refresh command.

The fourth output unit 242 includes a seventh transfer gate TG7 to output the fourth bank active signal BA<3> in response to the refresh command REFRESH and an eighth transfer gate TG8 to output the output signal of the fourth delayer 241 in response to the refresh command REFRESH.

Figure 7:
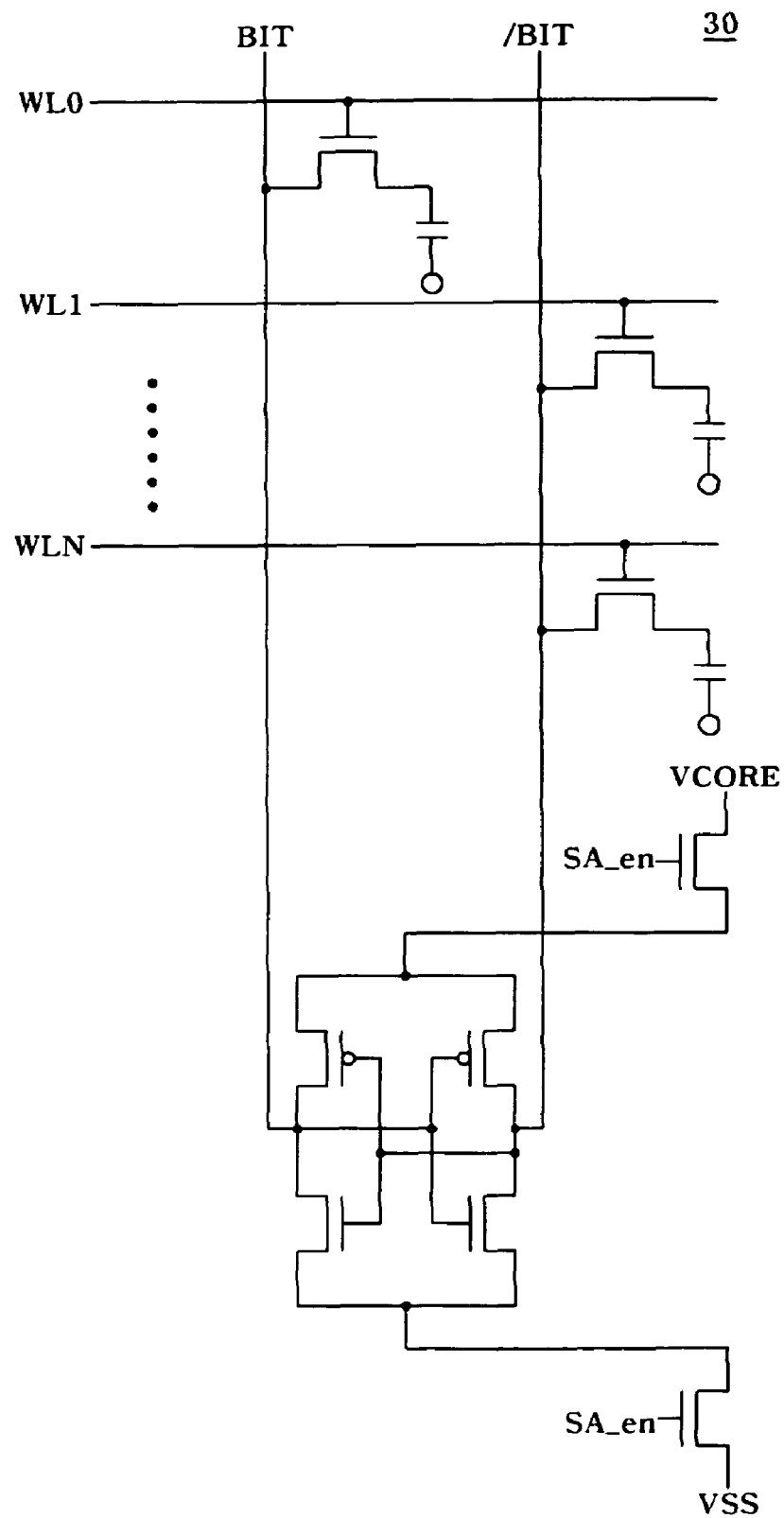
FIG. 7 is a circuit diagram illustrating a sense amplifier in the refresh control circuit of FIG. 4.

FIG. 7 is a circuit diagram illustrating the sense amplifier of FIG. 4. Referring to FIG. 7, the sense amplifier 30 restores the cell data by sense-amplifying and developing a voltage difference ($\Delta V$) between a bit line BIT and a bit bar line /BIT on which a charge sharing operations are carried out by an activation of a word line.

A refresh operation according to the exemplary embodiment of FIGS. 4-7 will be described below. Referring to FIGS. 3 and 4, when the refresh command REFRESH from the external circuit is inputted, an internal refresh counter 50 outputs the row address signals to select the word lines.

Next, the row decoder 10 outputs the row decoding signals to simultaneously activate all of the banks 40 in response to the first to fourth bank active signal BA<0:3> and the row address signals.

At this time, all of the banks 40 activate the word lines corresponding to the row deciding signals and the charges stored in the cell are shared with the bit line by the activated word line.

The enable signal control unit 20 sequentially outputs the first to fourth sense amplifier enable signals SA_en<0:3> in response to the refresh command REFRESH, by using the first to fourth bank active signals BA<0:3>, respectively. The first to fourth sense amplifier enable signals SA_en<0:3>, which correspond to the banks, are sequentially outputted at a time interval.

Referring to FIG. 5 and FIGS. 6A to 6D, the enable signal control unit 20 outputs the first sense amplifier enable signal SA_en<0> of the first bank after the lapse of the first delay section, the second sense amplifier enable signal SA_en<1> of the second bank after the lapse of the second delay section, the third sense amplifier enable signal SA_en<2> of the third bank after the lapse of the third delay section, and the fourth sense amplifier enable signal SA_en<3> of the fourth bank after the lapse of the fourth delay section.

The sense amplifier 30 restores the cell data by sense-amplifying and developing the voltage difference ($\Delta V$) between the bit lines BIT and /BIT on which a charge sharing operations are carried out by an activation of the word line.

That is, all of the banks are sequentially refreshed by the first to fourth sense amplifier enable signals SA_en<0:3>, respectively, at a constant time interval.

As apparent from the above, the present invention can obtain the current dispersion effect by refreshing all of the banks simultaneously and taking a time interval at the time of enabling the sense amplifiers.

Also, since the word lines are simultaneously enabled, an enablement of a specific bank does not have an influence on other blanks. Further, the present invention compensates for a refresh feature in which a bank is lately enabled because there is a difference between delta voltages ($\Delta V$) of the pairs of bit lines on a basis of bank due to the enabling timings between the sense amplifiers before a sense amplifying operation.

While the present invention has been described with respect to the particular examples and exemplary embodiments, it will be apparent to those skilled in the art that various changes and modifications may be made without departing from the scope of this disclosure and the following claims.

This disclosure claims priority to Korean application number 10-2008-0024987, filed on Mar. 18, 2008, the entire contents of which are incorporated herein by reference.

What is claimed is:

1. A semiconductor device having a refresh control apparatus, the refresh control apparatus comprising:
   first to fourth enable signal generating units for outputting sense amplifier enable signals by delaying bank active signal by first to fourth delay sections, respectively, in response to a refresh command.

2. The semiconductor device of claim 1, further comprising a sense amplifier configured to refresh banks at a time interval in response to the sense amplifier enable signals.

3. The semiconductor device of claim 1, wherein each of the first to fourth enable signal generating units includes:
   a delayer configured to delay a corresponding one of the bank active signals by a corresponding one of the first to fourth delay sections; and
   an output unit configured to output an output signal of the delayer, as a corresponding one of the first to fourth sense amplifier enable signals, when the refresh command is activated.

4. The semiconductor device of claim 3, wherein the first to fourth delay sections are sequentially increased in delay time.

5. A semiconductor device having a refresh control apparatus, the refresh control apparatus comprising:
   an internal refresh counter configured to output row address signals to select word lines when a refresh command is inputted from an external circuit;
   a row decoder configured to output row decoding signals to select all banks in response to bank active signals and the row address signals;
   an enable signal control unit configured to include first to fourth enable signal generating units for outputting sense amplifier enable signals by delaying the bank active signal by first to fourth delay sections, respectively, in response to the refresh command; and
   a sense amplifier configured to sequentially refresh all of the banks at a time interval in response to the sense amplifier enable signals.

6. The semiconductor device of claim 5, wherein the first enable signal generating unit includes:
   a first delayer configured to delay a first signal of the bank active signals by a first delay section; and
   a first output unit configured to output an output signal of the first delayer or the first signal of the bank active signals, as the first sense amplifier enable signal, in response to activation of the refresh command.

7. The semiconductor device of claim 6, wherein the first output unit includes:
   a first transfer gate configured to output the first signal of the bank active signals in response to the refresh command; and
   a second transfer gate configured to output the output signal of the first delayer in response to the refresh command.

8. The semiconductor device of claim 5, wherein the first enable signal generating unit includes:
   a second delayer configured to delay a second signal of the bank active signals by a second delay section; and
   a second output unit configured to output an output signal of the second delayer or the second signal of the bank active signals, as the second sense amplifier enable signal, in response to activation of the refresh command.

9. The semiconductor device of claim 8, wherein the second output unit includes:
   a third transfer gate configured to output the second signal of the bank active signals in response to the refresh command; and
   a fourth transfer gate configured to output the output signal of the second delayer in response to the refresh command.

10. The semiconductor device of claim 5, wherein the third enable signal generating unit includes:
    a third delayer configured to delay a third signal of the bank active signals by a third delay section; and
    a third output unit configured to output an output signal of the third delayer or the third signal of the bank active signals, as the third sense amplifier enable signal, in response to an activation of the refresh command.

11. The semiconductor device of claim 10, wherein the third output unit includes:
    a fifth transfer gate configured to output the third signal of the bank active signals in response to the refresh command; and
    a sixth transfer gate configured to output the output signal of the third delayer in response to the refresh command.

12. The semiconductor device of claim 5, wherein the fourth enable signal generating unit includes:
    a fourth delayer configured to delay a fourth signal of the bank active signals by a fourth delay section; and
    a fourth output unit configured to output an output signal of the fourth delayer or the fourth signal of the bank active signals, as the fourth sense amplifier enable signal, in response to an activation of the refresh command.

13. The semiconductor device of claim 12, wherein the fourth output unit includes:
    a seventh transfer gate configured to output the fourth signal of the bank active signals in response to the refresh command; and
    an eighth transfer gate configured to output the output signal of the fourth delayer in response to the refresh command.

14. The semiconductor device of claim 5, wherein the first to fourth delay sections are sequentially increased in delay time.

15. A method for refreshing a semiconductor device, said method comprising:
    simultaneously activating all banks in response to bank active signals;
    sequentially activating sense amplifier enable signals by delaying the bank active signal by first to fourth delay sections, respectively, in response to a refresh command; and
    sequentially refreshing the activated banks at a time interval in response to the sense amplifier enable signals.

16. The method of claim 15, further comprising activating word lines corresponding to row address signals in each bank for charge sharing operation when all of the banks are activated.

17. The method of claim 16, further comprising enabling a sense amplifier in a specific one of the banks to perform a refresh operation, wherein the rest of the banks carry out the charge sharing operation.

* * * * *